United States Patent [19]
Park

[11] Patent Number: 5,812,463
[45] Date of Patent: Sep. 22, 1998

[54] SYSTEM AND METHOD FOR A HIGH SPEED, HIGH VOLTAGE LATCH FOR MEMORY DEVICES

[75] Inventor: Eungjoon Park, Fremont, Calif.

[73] Assignee: Integrated Silicon Solution, Inc., Santa Clara, Calif.

[21] Appl. No.: 918,355

[22] Filed: Aug. 26, 1997

[51] Int. Cl.$^6$ .................................................. G11C 11/40
[52] U.S. Cl. ............................... 365/189.05; 365/185.23; 365/230.06
[58] Field of Search ......................... 365/185.23, 189.05, 365/189.09, 189.11, 230.06; 326/87, 92

[56] References Cited

U.S. PATENT DOCUMENTS

| 5,365,479 | 11/1994 | Hoang et al. ....................... | 365/189.09 |
| 5,396,459 | 3/1995 | Arakawa ............................. | 365/185.23 |
| 5,455,789 | 10/1995 | Nakamura et al. ................. | 345/185.23 |

*Primary Examiner*—Vu A. Le
*Attorney, Agent, or Firm*—Flehr Hohbach Test Albritton & Herbert LLP; Randall J. Bluestone

[57] ABSTRACT

The present invention provides a high speed, high voltage latch that minimizes leakage current and vulnerability to latch-up. The latch has a switching transistor between a program power supply and the output. The switching transistor is turned off by the latch input when the latch input transitions so as drive the output to a low level. The switching transistor thereby minimizes leakage current. An output driver transistor coupled to the program power supply is used. The latch output is initially pulled up through a Vcc power supply. The output driver transistor turns on after the latch output has been pulled up to an initial level. The output driver transistor then pulls up the output terminal to the high output voltage level through the program power supply. Pulling up the output initially with the Vcc power supply minimizes the device power dissipation. The latch circuit further comprises two program power supplies to prevent latch-up, an n-well power supply and a local power supply. When the latch is switched from read mode to program mode the n-well power supply is raised to the program voltage before the local power supply is raised. When the latch is switched from program mode to read mode the n-well power supply voltage is not reduced until after the local power supply has been reduced and the rest of the circuit has discharged. This ensures the n-well voltage is at least as high as the voltage of the p-diffusions coupled to the n-well and thereby prevents latch-up.

16 Claims, 4 Drawing Sheets

SYSTEM AND METHOD FOR A HIGH SPEED, HIGH VOLTAGE LATCH FOR MEMORY DEVICES

The present invention relates generally to semiconductor memory devices, and more particularly to a latch circuit.

BACKGROUND OF THE INVENTION

Solid state and flash memories are known in the art. An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the channel region. A control gate at least partially overlies the floating gate and is insulated therefrom.

In practice, a plurality of such memory cells are arrayed in addressable rows and columns to form a flash memory array. Individual cells in the array are accessed for purposes of writing, reading or erasing data by decoding row and column information.

Typically, the control gates for a group of cells in a given row are formed from a continuous strip of conductive material that defines a so-called word line, abbreviated "WL". A word line might comprise, for example, a group of eight cells that collectively store one byte. For a given column in the array, the drain leads of all cells in the column are coupled to a so-called bit line, abbreviated "BL". The source leads of the various cells are collectively switchably coupled to one of several potential levels, depending upon whether cells in the array are to be programmed (written) or erased or are to be read.

Within the memory array, an individual cell is addressed and thus selected for reading, programming (writing) or erasing by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into sectors. Cell addressing is accomplished by coupling address bits to preceding x-decoders and to precoding y-decoders whose respective outputs are coupled to word lines and bit lines in the array.

Programming an addressed MOS memory cell occurs in a program mode by accelerating so-called hot electrons (from the device substrate). These electrons are injected from the drain region through the thin gate oxide and onto the floating gate. The control gate-source threshold voltage required before substantial MOS device drain-source current occurs is affected by the amount of such charge retained on the floating gate. Thus, storage cell programming forces the floating storage gate to retain charge that will cause the cell to indicate storage of either a logic "1" or "0" in a read-out mode.

The above-described storage cells are non-volatile in that the charge on the storage gate, and thus the "0" or "1" bit stored in the cell, remains even when control and operating voltages to the array are turned off. In the program (write) mode, the control gate is coupled to a high positive potential of perhaps +10 V, the drain is coupled to perhaps +6 V, and the source and substrate are grounded (meaning that they are coupled to the circuit ground node). This causes the hot electrons to be generated and captured by the floating gate.

In a read mode, the charge stored on the floating gate of an addressed MOS memory cell is read by coupling perhaps +5 V to the control gate, and reading drain-to-source current. The presence or absence of charge on the stored gate will define a binary "1" or "0" bit that is read-out from the addressed memory cell by a sense amplifier coupled to the bit line.

In an erase mode, the electrons trapped on the floating gates of a group of addressed MOS memory cells are encouraged to flow by electron tunneling to the source. During this erase mode, a group of word line decoders cause the addressed cells' control gates to be coupled to ground, or 0 V, the sources to be coupled to perhaps +11 V and the drains to float, with the substrates being coupled to ground. Note that in a flash memory configuration, entire sector-sized blocks of cells may be simultaneously erased, in a "flash."

FIG. 1 illustrates a conventional low voltage flash memory address latch. The latch circuit has two main modes of operation, read mode and program mode. In the read mode the read address bit signals arrive at the outb input of the latch. The latch circuit inverts the signal and shifts the Hout high level to higher than Vcc. The Hout output drives the word line of a memory cell. In the program mode the latch circuit inverts the outb input signal and shifts the digital high signal level from Vcc at the outb input to about 10 V at the Hout output. The voltages in the program mode and the read mode at the labeled nodes in the circuit are provided in Table 1:

TABLE 1

|  | outb | pplusb | loc_Vpp | Hout |
| --- | --- | --- | --- | --- |
| Read mode | 0V/Vcc | Vcc | Vcc + 2V | (Vcc + 2V)/0V |
| Program mode | 0V/Vcc | Vcc | ~10V | ~10V/0V |

The outb input receives a digital signal representing address bits. The outb input signal levels are 0 V and Vcc. In the read mode the pplusb node is set to Vcc, the local program voltage power supply terminal loc_Vpp is raised to Vcc+2V and the Hout output signal swings between 0 V and Vcc+2V. In the program mode the loc_Vpp program voltage power supply is further raised to about 10 V to generate a sufficiently high voltage level to inject electrons in the flash memory cell from the drain region through the gate oxide onto the floating gate.

Problems with the prior art latch circuit of FIG. 1 include that in low voltage operation the device may not read cells accurately due to large leakage currents from loc_Vpp to ground which degrade the Hout high signal levels, and the circuit is vulnerable to latch-up failures.

The Hout output terminal drives the word line of a memory cell. To accurately read a memory cell the Hout output voltage must be sufficiently high to turn on a memory cell that is in the low threshold voltage logic state. In an EPROM or flash memory the memory cell stores the logic state based on the amount of charge stored on the floating gate of the storage transistor. For example, in an EPROM where in the programmed (logic '0') state the threshold voltage is higher than in the unprogrammed (logic '1' state), when charge is added to the memory cell's floating storage gate it increases the threshold voltage of the select gate. When the cell is programmed, the negative charge on the floating gate increases the select gate threshold voltage so that the memory cell transistor remains off when a positive reading voltage is applied to the select gate. Whereas, when the cell is unprogrammed there is less charge on the floating gate, and the positive reading voltage is sufficient to turn on the transistor. Thus a memory cell transistor that turns on when read is interpreted as a logic '1' and a memory cell transistor that does not turn on is interpreted as a logic '0.'

The power supply voltages used in memory devices have been reduced to reduce the power dissipation. The threshold voltage of the memory cell transistors depends on device fabrication process parameters, and is independent of the power supply. A typical flash cell or EPROM cell may have a threshold voltage of 2 V to 2.5 V. When a 2.5 V or 3 V power supply level is used, the loc_Vpp voltage may be bootstrapped to provide a sufficiently high Hout high voltage level to read the memory cell. Typically the Hout high signal level should be 1 or 2 V higher than the threshold voltage of the memory cell to reliably read the cell. In low voltage operation, the prior art FIG. 1 latch is vulnerable to unreliable memory cell read operations due to degradation of the Hout high signal level caused by leakage in the Hout output high to low transition.

The degredation of the Hout high signal level in the conventional latch circuit of FIG. 1 is made clear by analyzing the operation of the circuit in the read mode. In the read mode the pmode terminal is at 0 V which turns PMOS transistor P102 on. In the steady state when the outb input is low and Hout is high, NMOS transistor N115 is on. Transistor N114 is on because its gate is coupled to Vcc. Therefore the gate at transistor P101 is low, and transistor P101 is on. When the outb input goes high, NMOS transistor N112 turns on. Transistor N111 is already on. Therefore there is a leakage current at the Hout high to low transition from the program mode power supply loc_Vpp to ground through the path defined by transistors P101, P102, N111 and N112. This leakage current degrades the Hout signal level at other cells that the loc_Vpp power supply is coupled to. When loc_Vpp is reduced in a cell that is performing a read operation, the Hout level of that cell may be not be sufficient to turn on the memory cell. Thus, the prior art latch may incorrectly read a memory cell as being in a programmed logic '0' state where the transistor is off, when in fact the storage transistor was in an unprogrammed logic '1' state, but an inadequate positive read voltage was applied to turn the transistor on.

Another problem caused by the leakage current is that the leakage current requires more current to be pulled through the pull down transistors to reduce the Hout output to a logic low level, and thereby slows down the switching speed of the latch. The latch switching speed is critical because the latch is in the high speed path of the memory device. A large leakage current can therefore cause the memory device to fail high speed testing, or when the device is in a system it can cause errors in memory access operations.

The latch circuit of FIG. 1 is particularly vulnerable to latch-up problems when the latch is switched from program mode to read mode. In CMOS devices parasitic bipolar transistors and Silicon Controlled Rectifiers (SCR's) are formed. When sufficiently high voltage differentials are created across the parasitic devices they can turn on which can result in the shorting of the power and ground lines resulting in either destruction of the chip or system failure. This is called latch-up. When the latch device is switched from program mode to read mode, the voltage at the loc_Vpp terminal is reduced from about 10 V to Vcc. The Hout terminal output high level is also reduced from 10 V to Vcc. The substrate terminals of transistors P101 and P102 are coupled to an n-well. Hout is a high capactive node. The voltage level at Hout therefore changes slower than some of the other nodes in the latch circuit. As a result, the higher voltage at Hout when loc_Vpp is reduced to Vcc can cause latch-up through the n-well.

Thus an improved high voltage latch, for low voltage memory devices that overcomes these and other problems of the prior art would be highly desirable.

SUMMARY OF THE INVENTION

The present invention provides a high speed, high voltage latch that minimizes leakage current and vulnerability to latch-up, while ensuring reliable memory read operations at a low power supply voltage. In one embodiment for a low voltage flash memory device, a switching transistor is inserted between a program power supply and the output of the circuit. The gate of the switching transistor is coupled to the input of the latch circuit. The switching transistor turns off immediately when the input goes high. This minimizes leakage current from the program power supply to ground when the output is pulled low. Reducing the leakage current increases the switching speed of the circuit and protects the latch circuit output high signal level.

In low voltage memory devices, a 3 V power supply may be used with storage transistors having a 2.5 V turn on voltage. The power supply is bootstrapped to at least Vcc+1 V during a read operation to provide a sufficiently high voltage to reliably read the memory cells. To minimize power consumption it is desirable to keep the charge pumps driving the bootstrap as small as possible. The switching transistor, by reducing the leakage current, prevents degradation of the small charge pump driven power supply voltage which ensures adequate read voltage levels to reliably read memory cell logic levels.

A latch circuit embodiment of the present invention further comprises an output driver transistor that is configured to turn on after the latch output terminal has reached a predetermined level. The latch output is first pulled up by the Vcc power supply to an initial level. While the latch output is being pulled up, the voltage of a capacitor coupled to the control terminal of the output driver transistor is pulled down, so that after the latch output has been pulled up to the initial level by the Vcc power supply, the driver transistor pulls up the latch output to a bootstrapped voltage with the program power supply. Pulling up the latch output initially through the Vcc power supply minimizes the charge drawn from the bootstrapped program power supply. This allows a small charge pump to be used to bootstrap the program power supply and minimizes the power dissipation of the memory device.

An embodiment of the latch circuit of the present invention further has two program power supplies, Vppwell2 and loc_Vpp, to prevent latch-up conditions. The Vppwell2 is coupled to an n-well. Separating the program power supplies allows the Vppwell2 supply to be maintained at a voltage at least as high as the rest of the circuit. This prevents forward biasing p-n junctions formed by p-diffusions coupled to the n-well, and thereby prevents latch-up. In operation, when the latch is switched from read mode to program mode, the Vppwell2 power supply voltage is raised first from Vcc to 10 V. After Vppwell2 has been raised, the loc_Vpp power supply is raised. Similarly, when the latch is switched from program mode to read mode, the loc_Vpp power supply is reduced first. After the circuit has had ample time to discharge, the Vppwell2 power supply is reduced.

Thus the present invention provides a high speed, high voltage latch that minimizes leakage current and vulnerability to latch-up, while ensuring reliable memory read operations at a low power supply voltage.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
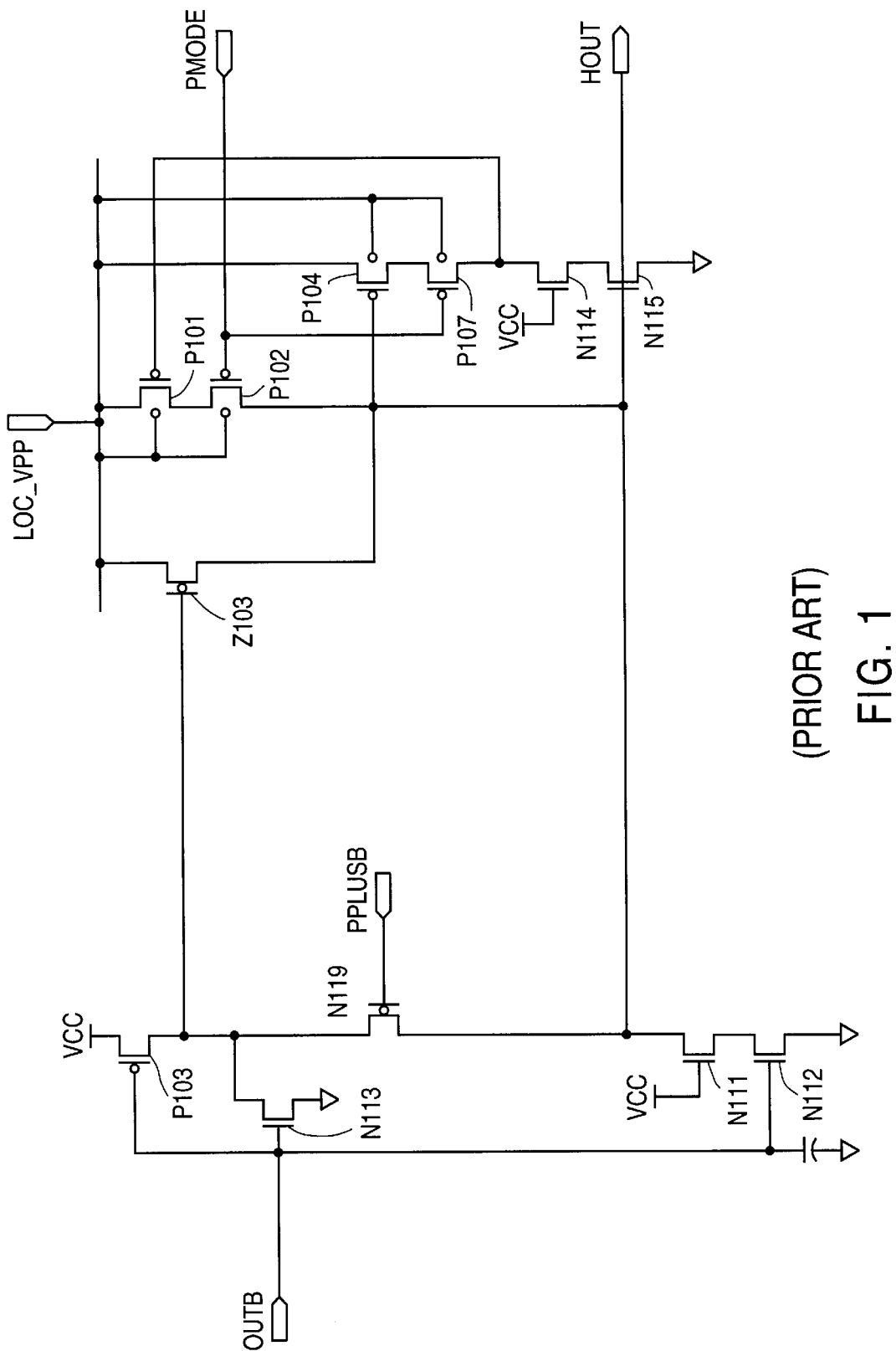
FIG. 1 illustrates a circuit diagram of a prior art latch for a low voltage flash memory system.
Figure 2:
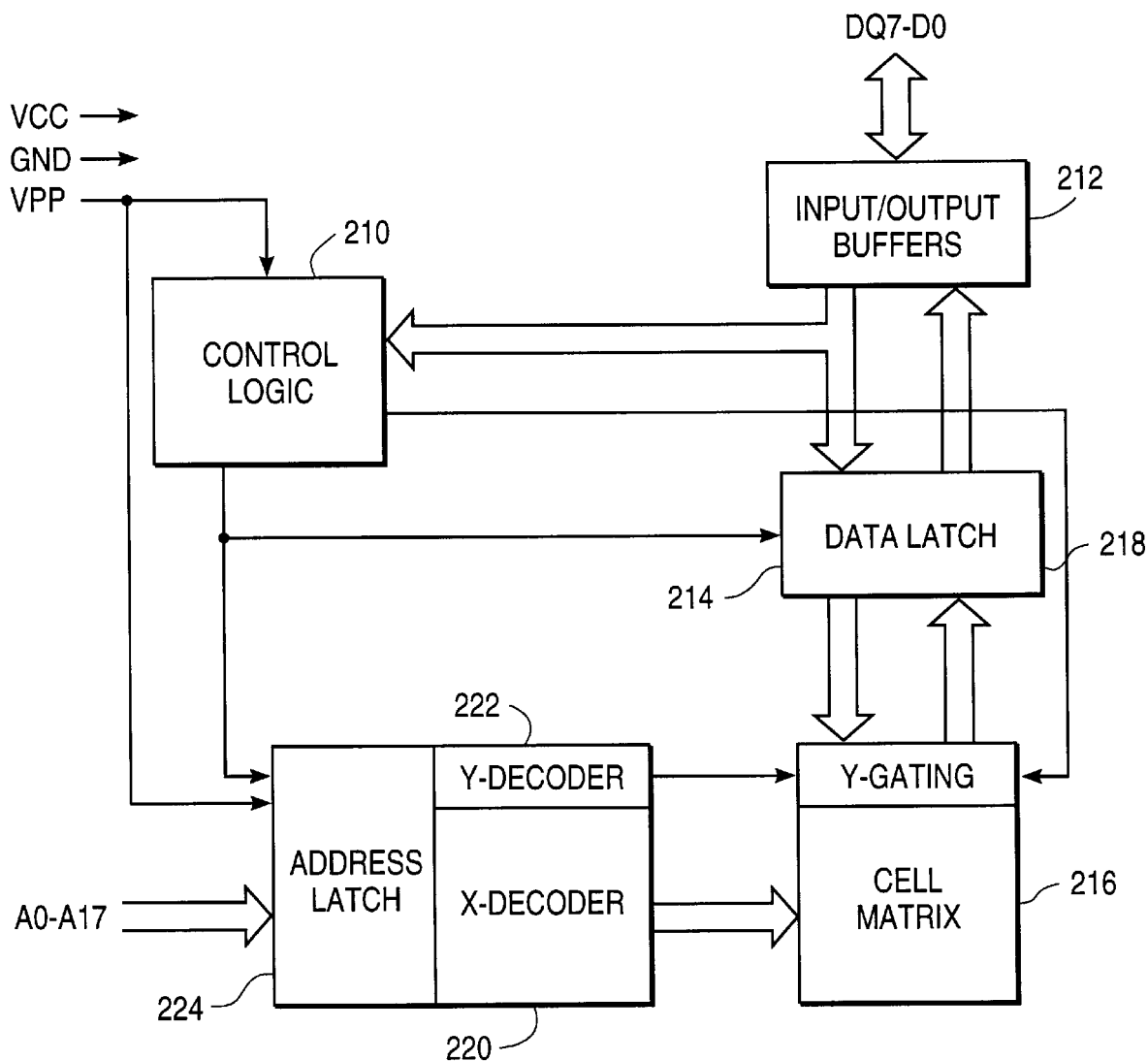
FIG. 2 illustrates a block diagram of a flash memory system in which the present invention may be implemented.

FIG. 2 illustrates a block diagram of a CMOS flash memory device in which the present invention may be implemented. Vcc is one of the device power supplies. In one low voltage embodiment Vcc is 3 V. Vpp is the program mode power supply. Vpp is 10 V in the program mode. Control logic block 210 provides the control signals to activate the program mode, read mode and erase mode of the memory device. Memory cell address locations are provided through address lines A0–A17. These addresses are latched into address latch 224. X-decoder 220 and Y-decoder 222 activate the word lines corresponding to the memory cells in cell matrix 216 defined by the latched addresses. In a read operation data is outputted to data latch 218 and then transferred to input/output buffers 212. In a program operation data is provided by data latch 218 and stored in cell matrix 216.

Figure 3:
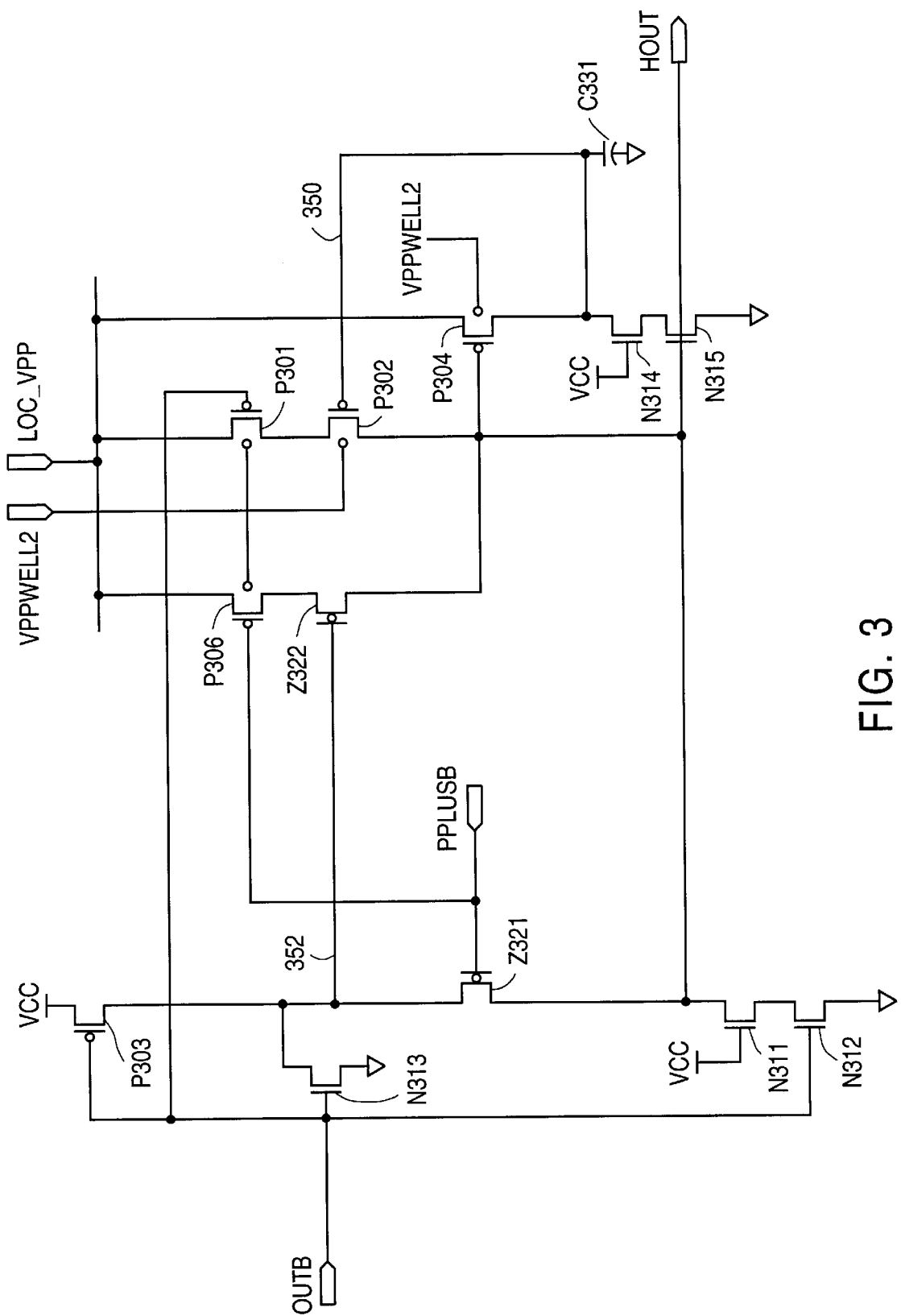
FIG. 3 illustrates a circuit diagram of a high performance, high voltage latch for a low voltage flash memory system according to one embodiment of the present invention.

FIG. 3 illustrates a circuit diagram of a high performance, high voltage latch for a low voltage flash memory system according to one embodiment of the present invention. The general operating modes of the circuit are first described, followed by a more detailed description of the transistor level operation of the latch. One application of the latch is at the output of the X-decoder 220 or at the output of the Y-decoder 222, illustrated in the flash memory device of FIG. 2. The latch circuit of the present invention can also be applied to other memory devices, including for example, EPROMs and low voltage DRAMs. In the read mode the latch inverts the signal level at the outb input of the circuit and maintains the inverted output at the Hout output terminal. In the program mode the latch inverts the outb input signal and level shifts the digital high signal level to approximately 10 V. The Vppwell2 and loc__Vpp nodes are the program mode power supplies, and the pplusb node is a control signal. Table 2 describes the voltages at each labeled node in the program mode and the read mode:

TABLE 2

|  | outb | pplusb | Vppwell2 | loc__Vpp | Hout |
| --- | --- | --- | --- | --- | --- |
| Read mode | 0V/Vcc | Vcc | Vcc+2 V | Vcc+2 V | Vcc+2V/0V |
| Program mode | 0V/Vcc | Vcc | ~10V | ~10V | ~10V/0V |

In the read mode the input outb terminal receives digital signals with a nominal digital low level of 0 V and a nominal digital high level of Vcc. In one low voltage embodiment of the present invention the local Vcc can be as low as 2.5 V. The pplusb terminal signal controls the isolation transistor Z321 and is forced to Vcc in the read mode. Vppwell2 is one of the program mode power supply terminals. Loc__Vpp is the second program mode power supply terminal. The same voltage is applied to Vppwell2 and loc__Vpp terminals most of the time. In an embodiment of the present invention, when the device is switched between read and program mode the voltages at the Vppwell2 and loc__Vpp terminals are switched at different times. Hout is the output terminal of the circuit. Hout is an inverted output so when outb is low, Hout is high, and when outb is high, Hout is low. The nominal Hout digital low and high signal levels are 0 V and loc__Vpp respectively. The Hout terminal essentially drives a word line in cell matrix 216, illustrated in FIG. 2. Therefore in the read mode Hout must be high enough to accurately read the memory cell. For example, in an EPROM device where the erased state, corresponds to a logic '1', the Hout voltage level must be greater than the turn on voltage of the memory cells in the erased state. If the Hout voltage is not high enough then the memory cell transistors in the erased state may not turn on when read which would cause the cell to be misread as being in the program state corresponding to a logic '0'.

In the program mode, the outb input signal levels are the same as in the read mode 0 V and Vcc. The pplusb terminal is at Vcc, which turns transistor Z321 on. The Vppwell2 and loc__Vpp terminals are at approximately 10 V. In a flash memory cell, the high program mode voltage is used to inject electrons through the thin gate oxide and onto the floating gate so as to program the logic state of a memory cell. The higher program mode power supply voltage provides the larger program mode Hout swing with nominal digital low and high signal levels of 0 V and loc__Vpp which is about 10 V. For simplicity, the program mode voltage is referred to as being 10 V, in actual applications the program mode voltage may vary.

SWITCHING BETWEEN READ MODE AND PROGRAM MODE

Figure 4:
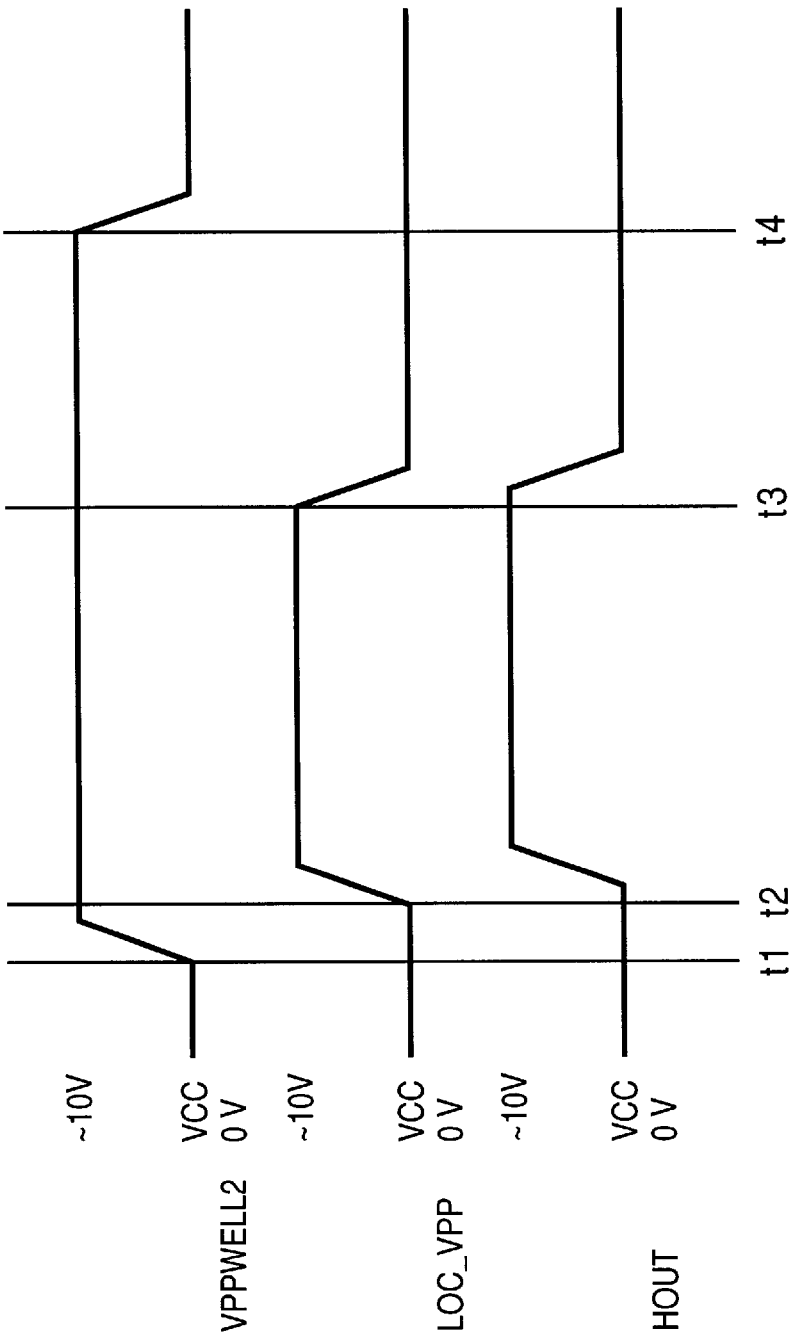
FIG. 4 is timing diagram illustrating the transition between read mode and program mode of the FIG. 3 latch.

FIG. 4 illustrates the transition between the read mode and the program mode. The latch circuit embodiment of FIG. 3 uses two separate program power supplies. One program power supply is coupled to the Vppwell2 terminal, and the second program power supply is coupled to the loc__Vpp terminal. Controlling the voltages at Vppwell2 and loc__Vpp independently as illustrated in FIG. 4 reduces the risk of latch-up. The Vppwell2 supply is coupled to the n-well substrate of PMOS transistors P301, P302, P304 and P306. The loc__Vpp supply is coupled to the source terminals of transistors P301, P304 and P306. In the steady state the Vppwell2 power supply keeps the Vppwell2 n-well at least as high as the p-junction drain voltages of those transistors. This keeps the junction between the transistor drains and the n-well back biased. If the Hout terminal were to be at a higher voltage than the Vppwell2 n-well voltage then this may cause the p-n junction between one of the drains of transistors P301, P302, P304 or P306 and the n-well to forward bias causing a latch-up condition. The current flowing from Hout to ground in such a latch-up condition could destroy the device or cause system failure. The Hout node is a high capacitive node relative to other nodes in the latch circuit. Therefore, when the power supply voltages are changed between read mode and program mode levels, the Hout voltage lags the voltage at other nodes in the circuit. To prevent latch-up when the latch is switched from program mode to read mode the Vppwell2 and loc__Vpp power supplies are controlled as illustrated in FIG. 4.

In FIG. 4, the latch is initially in read mode. The Vppwell2, loc__Vpp and Hout nodes are all at Vcc. The transition to program mode begins at time t1 when the Vppwell2 voltage is raised from Vcc to 10 V. After Vppwell2 has been raised to 10 V, the voltage at the loc__Vpp terminal is raised to 10 V at time t2. When Hout is at a digital high level, raising the loc_Vpp voltage pulls up the Hout voltage level to loc_Vpp. Hout is pulled up through transistors P301 and P302. Raising the loc_Vpp power supply voltage after raising the Vppwell2 power supply voltage prevents latch-up during the transition from read mode to program mode by ensuring that the Hout terminal will not be raised to a higher voltage than the Vppwell2 n-well voltage. In one embodiment loc_Vpp is driven high about 100 ns after Vppwell2 is driven high.

In the transition from program mode to read mode, the loc_Vpp program mode power supply is first reduced from 10 V to Vcc at time t3. This causes the voltage at Hout to fall to Vcc. After the voltage at Hout and other high voltage nodes in the latch circuit have discharged to Vcc then at time t4 the Vppwell2 voltage is reduced from 10 V to Vcc. In one embodiment, the Vppwell2 voltage is reduced 500 ns after the loc_Vpp voltage to provide ample time for the high voltage nodes to discharge. The appropriate delay depends in part upon the capacitance of the Hout output terminal and the clock frequency of the system. Separating the Vppwell2 and loc_Vpp terminals, and delaying the reduction of the Vppwell2 voltage until after the high voltage nodes have discharged to Vcc prevents latch-up during the program mode to read mode transition.

PULLING OUTPUT LOW

The high performance, high voltage latch for low voltage flash memory devices illustrated in FIG. 3 also maximizes performance by reducing leakage currents. The FIG. 3 embodiment is essentially comprised of an input circuit, an isolation circuit and an output circuit. The input circuit is comprised of PMOS transistor P303, and NMOS transistors N311, N312 and N313. The isolation circuit is primarily comprised of transistor Z321. Transistors Z321 and Z322 are native transistors. Native transistors are NMOS transistors with a low turn-on threshold voltage. Whereas a typical NMOS transistor may have a threshold voltage of 0.7 V, a native NMOS transistor may have a threshold voltage of 0.2 V. The output circuit comprises the remainder of the circuit shown to the right of the pplusb terminal in FIG. 3.

The FIG. 3 embodiment uses transistor P301 to reduce leakage when the Hout output is pulled down from a digital high level to a digital low level. In operation, in the steady state where outb is at a digital low level and Hout is at a digital high level, the low input voltage at the gate of transistor P301 keeps transistor P301 on. The gate of transistor N315 is coupled to Hout, therefore transistor N315 is on. Transistor N314 is also on because its gate is coupled to Vcc. Transistor N314 is coupled to the gate of PMOS transistor P302. Thus, transistors N314 and N314 pull the gate of transistor P302 to ground, which keeps transistor P302 on. With transistors P301 and P302 on, the Hout terminal is coupled to loc_Vpp and is at a digital high level.

In the read mode, when the input signal at outb goes high, the signal is directly coupled to the gate of PMOS transistor P301 which turns P301 off. The high level outb input signal is also coupled to NMOS transistor N312, which turns transistor N312 on. The gate of NMOS transistor N311 is coupled to Vcc, therefore transistor N311 is on. With transistor N311 on, the Hout output terminal is coupled to ground through transistors N311 and N312. Transistors N311 and N312 thereby pull the Hout output voltage to a digital low level. Switching PMOS transistor P301 off by coupling the P301 gate directly to the outb input terminal prevents current from leaking from the loc_Vpp power supply to ground through transistors P301, P302, N311 and N312 when the outb input signal switches high. If transistor P301 were not in the latch circuit, then when the outb input signal went high, transistors N311 and N312 would be turned on. There would then be a short interval when transistors N311, N312 and P302 were all on. This is because before transistor P302 is turned off, first the Hout voltage falls below the threshold voltage of NMOS transistor N315, which turns transistor N315 off. Then the node 350 voltage must be driven above the threshold voltage of PMOS transistor P302 to turn transistor P302 off. If transistors N311, N312 and P302 were all on simultaneously, this would cause current leakage from loc_Vpp to ground through the path formed by transistors P302, N311 and N312. This leakage could then reduce the voltage level of the Hout signal in other latch circuits. If the loc_Vpp level was reduced, then a latch cell that was performing a read operation may not have a sufficiently high Hout voltage level to turn on a memory cell in the low threshold voltage logic state. This could cause the cell to be misread. In the FIG. 3 embodiment, this potential leakage problem is avoided by inserting the P301 switching transistor to isolate loc_Vpp from ground when the outb input signal switches from low to high.

DRIVING PUTPUT HIGH

Transistor P301 also improves the switching speed of the latch circuit. By preventing leakage current from loc_Vpp to ground when the outb input switches from low to high, transistor P301 reduces the amount of charged that pulldown transistors N311 and N312 have to dissipate to pull the Hout output voltage to a digital low level. Transistor P301 thereby increases the switching speed of the latch. Transistors N311 and N312 are also designed to be large so that they can pull down the Hout output rapidly. Another advantage of using transistor P301 is that transistor P302 can be made large to rapidly pull-up Hout during the Hout low to high transition, without increasing the leakage current during the Hout high to low transition.

The high performance, high voltage latch circuit of FIG. 3 minimizes current drawn from the loc_Vpp terminal when the Hout output is switched from low to high in the read mode. Minimizing the current drawn from loc_Vpp enables the FIG. 3 latch to operate at low power supply voltage and ensures that a sufficiently high Hout signal level is provided to reliably read the memory cell. In the read mode, when the memory device is in standby the loc_Vpp voltage is Vcc. When the outb input switches, the loc_Vpp voltage is bootstrapped to, for example, Vcc+2 V. Loc_Vpp remains at this bootstrapped voltage long enough to ensure that the memory cell has been read and the data latched. This is done to minimize the power dissipation of the device. The less charge that is lost to leakage the smaller the charge pump that can be used to bootstrap loc_Vpp, and the lower the power dissipation of the memory device.

In operation, when the outb input signal is at a high level PMOS transistor P303 is off because the transistor P303 gate is coupled to outb. NMOS transistors N311 and N312 are on which pulls the Hout voltage to ground. In the read mode, the pplusb terminal is at Vcc which means native transistor Z321 is on. The Vcc voltage level at the pplusb terminal also turns PMOS transistor P306 off. PMOS transistor P304 is on because the P304 transistor gate is coupled to the Hout terminal which is low. The gate of NMOS transistor N315 is also coupled to Hout, which means transistor N315 is off. With transistor N315 off and transistor P304 on, the node 350 is charged to loc_Vpp which turns PMOS transistor P302 off. Transistors P302 and P306 being off isolates the loc_Vpp power supply from Hout.

When the outb signal goes from high to low, NMOS transistor N312 is turned off isolating Hout from ground. PMOS transistor P303 is turned on, and native transistor Z321 is already on. With transistors P303 and Z321 on, Hout is brought up to Vcc-Vt of Z321 through transistors Z321 and P303 by the Vcc power supply. The loc_Vpp power supply is not used to pull Hout up during this first phase of the Hout low to high transition. Transistors P306 and P302 remain off which isolates the loc_Vpp power supply from Hout.

PMOS transistor P304, NMOS transistors N314 and N315, and capacitor C331 form a feedback system that delays the turn on of PMOS transistor P302 when the outb input goes low. The turn on of transistor P302 is delayed to allow Hout to be initially pulled up through the Vcc power supply via transistors P303 and Z321 so as to minimize the current drawn from loc_Vpp. In one embodiment the size of capacitor C331 is selected to be large enough to delay the turn on of transistor P303 until after Hout has been pulled up to Vcc-Vt by the Vcc power supply. Capacitor C331 should also be small enough to provide a sufficiently fast Hout rise time. In one embodiment, capacitor C331 is 0.1 pf.

In operation, with Hout low, PMOS transistor P304 is on which charges node 305 to loc_Vpp. Pulling Hout up through Vcc turns P304 off. When Hout is pulled up by Vcc above the threshold voltage of NMOS transistor N315, transistor N315 turns on. The gate of transistor N314 is coupled to Vcc, so transistor N314 is on. With transistors N314 and N315 on and transistor P304 off, the node 350 voltage is pulled down to ground through transistors N314 and N315. When the node 350 voltage is pulled down below the PMOS transistor P302 threshold voltage, transistor P302 turns on. PMOS transistor P301 is turned on when the outb input goes low, therefore transistor P301 is on. With transistors P301 and P302 on, Hout is pulled up to loc_Vpp in the second phase of the Hout low to high transition. As described above, when outb switches, loc_Vpp is bootstrapped to, for example, Vcc+2 V. Pulling up Hout to Vcc-Vt through Vcc during the initial phase of the Hout low to high transition minimizes the current drawn from loc_Vpp. This allows a smaller charge pump to be used, while ensuring a sufficiently high Hout voltage level to reliably read the memory cells.

Thus the present invention provides a high speed, high voltage latch that minimizes leakage current and vulnerability to latch-up, while ensuring reliable memory read operations at a low power supply voltage.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A latch circuit comprising:

an input circuit; and an output circuit having a power supply terminal, an output terminal and a switching transistor having a control terminal, said switching transistor configured in series between said power supply terminal and said output circuit output terminal, said switching transistor control terminal coupled to said input circuit, wherein said switching transistor is off when said input circuit is in a first state, and said switching transistor is on when said input circuit is in a second state, so that said switching transistor reduces current leakage.

2. The latch circuit of claim 1 further comprising a driver transistor, said driver transistor coupled in series between said switching transistor and said output circuit output terminal.

3. The latch circuit of claim 2 wherein said latch circuit is a high voltage latch for a low voltage memory device.

4. The latch circuit of claim 3 wherein said input circuit first state is a logic high level; and wherein said input circuit second state is a logic low level.

5. The latch circuit of claim 2 wherein said driver transistor turns on so as to increase a voltage at said output circuit output terminal after a predetermined time after said voltage at said output circuit output terminal begins to be pulled up.

6. The latch circuit of claim 5 further comprising a capacitor; and wherein said driver transistor further has a third terminal, said third terminal coupled to said capacitor so that said capacitor delays the turn on of said driver transistor.

7. The latch circuit of claim 6 wherein said latch circuit is a high voltage latch for a low voltage memory device.

8. The latch circuit of claim 7 further comprising a second power supply terminal; and wherein said driver transistor turns on after said output circuit output terminal voltage is pulled up to a voltage at said second power supply terminal minus a transistor threshold voltage.

9. A latch circuit for a memory device comprising:

an input circuit; and an output circuit, said output circuit coupled to said input circuit, said output circuit having first power supply terminal, a second power supply terminal, a third power supply terminal, a well, and an output terminal, said first power supply terminal coupled to said well, wherein in a program mode said first power supply terminal and said second power supply terminal provide a program voltage to said output circuit, and wherein a voltage provided at said first power supply terminal is independent of a voltage at said second power supply terminal.

10. The latch circuit of claim 9 wherein said latch circuit can operate in said program mode and in a read mode, when said latch circuit is switched from said program mode to said read mode, said second power supply terminal is reduced from said program voltage to a read voltage, said first power supply is reduced from said program voltage to said read voltage after voltages in said latch circuit have discharged to below a predetermined level.

11. The latch circuit of claim 10 wherein when said latch circuit is switched from said read mode to said program mode, a voltage at said first power supply terminal is raised to said program voltage, then a voltage at said second power supply voltage is raised to said program voltage.

12. A method of switching between a program mode and a read mode in a memory device comprising the steps of:

applying a program level voltage to a first power supply terminal;

applying a program level voltage to a second power supply terminal;

reducing said voltage at said second power supply terminal to a read level voltage;

reducing said voltage at said first power supply terminal to a read level voltage after a first time delay after reducing said voltage at said second power supply terminal.

13. The method of claim 12 wherein said first time delay allows a voltage in said memory device to discharge from said program voltage to said read voltage.

14. The method of claim 12 further comprising the steps of:

increasing said voltage at said first power supply terminal to a program level voltage;

increasing said voltage at said second power supply terminal to a program level voltage after a second time delay after increasing said voltage at said first power supply terminal.

15. The method of claim 14 wherein said memory device is a flash memory device.

16. The method of claim 15 wherein said first power supply terminal is coupled to a well.

* * * * *